United States Patent
Devoe et al.

(10) Patent No.: US 10,224,670 B2
(45) Date of Patent: Mar. 5, 2019

(54) CIRCUIT BOARD WITH ANCHOR CLEAT FOR A CONNECTOR

(71) Applicant: Facebook Technologies, LLC, Menlo Park, CA (US)

(72) Inventors: Matthew James Devoe, Menlo Park, CA (US); Rong Xu, Stanford, CA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 15/651,633

(22) Filed: Jul. 17, 2017

(65) Prior Publication Data

US 2019/0020147 A1 Jan. 17, 2019

(51) Int. Cl.
*H01R 13/58* (2006.01)
*H01R 4/02* (2006.01)
*H01R 13/66* (2006.01)

(52) U.S. Cl.
CPC ......... *H01R 13/5833* (2013.01); *H01R 4/027* (2013.01); *H01R 13/6658* (2013.01)

(58) Field of Classification Search
CPC .................................................. H01R 13/5833
See application file for complete search history.

(56) References Cited

U.S. PATENT DOCUMENTS

| | | | | |
|---|---|---|---|---|
| 3,419,670 A * | 12/1968 | Schneider | .......... | H01R 13/5833 174/135 |
| 3,997,234 A * | 12/1976 | Worman | ............ | H01R 13/6335 439/456 |
| 6,538,207 B1 * | 3/2003 | Barth | ................ | H01R 13/5833 174/254 |
| 6,663,414 B2 * | 12/2003 | Kume | .................. | H05K 3/3405 361/826 |
| 7,234,958 B1 * | 6/2007 | Copus | ................ | H01R 12/7076 439/371 |
| 7,563,139 B1 * | 7/2009 | Wang | .................... | H01R 4/4818 439/620.31 |
| 8,110,753 B2 * | 2/2012 | Chen | ....................... | H05K 3/306 174/261 |
| 9,666,979 B1 * | 5/2017 | Zucker | ............... | H01R 13/5833 |
| 2007/0202743 A1 * | 8/2007 | Mikami | ................... | H01R 4/64 439/587 |
| 2013/0180778 A1 * | 7/2013 | Yamamoto | ........... | H01R 4/5041 174/74 R |
| 2014/0216811 A1 * | 8/2014 | Turner | ............... | H01R 13/5816 174/659 |
| 2017/0171992 A1 * | 6/2017 | Long | .................... | H05K 5/0026 |

* cited by examiner

*Primary Examiner* — James Harvey
(74) *Attorney, Agent, or Firm* — Morgan, Lewis & Bockius LLP

(57) ABSTRACT

A connector assembly includes a flexible cable that includes a casing, a plurality of electrical wires each having a first portion encapsulated by the casing and a second portion extending beyond the casing, and a fiber having a first portion encapsulated by the casing and a second portion extending beyond the casing. The connector assembly further includes a housing having a first end to receive the flexible cable and a second end with a connector to connect with another connector, and a circuit board disposed in the housing. The circuit board includes first terminals to connect with the plurality of electrical wires, second terminals to connect with the connector, a plurality of traces coupling respective first terminals with respective second terminals, and a cleat. The second portion of the fiber extends beyond the casing to the cleat and winds around the cleat.

20 Claims, 5 Drawing Sheets

CIRCUIT BOARD WITH ANCHOR CLEAT FOR A CONNECTOR

TECHNICAL FIELD

This application relates generally to cable connectors, including but not limited to a cable connector assembly in a system with a head-mounted display, a computer, and flexible cable that couples the head-mounted display to the computer.

BACKGROUND

Virtual-reality head-mounted displays (HMDs) have wide applications in various fields, including engineering design, medical surgery practice, military simulated practice, video gaming, etc. Virtual-reality systems require a high volume of data communication between the HMD and the computer. Historically, cables are used in such systems for conveying the high volume of data. Cables, however, restrict the user from full freedom of movement. Furthermore, virtual-reality systems may lack the ability to withstand tension forces, which may cause damage to the virtual-reality systems (e.g., damage connections within the virtual-reality systems).

SUMMARY

Accordingly, there is a need for a cable that can withstand tension forces (e.g., when the cable is pulled taut). Users of virtual-reality systems often become engrossed in their virtual reality and do not recognize boundaries set by physical limitations such as the length of the cable connecting the HMD to the computer. The assemblies and methods disclosed herein address this need.

In accordance with some embodiments, an electrical cable connector assembly includes a flexible cable, comprising: (i) a casing, (ii) a plurality of electrical wires each having a first portion encapsulated by the casing and a second portion extending beyond the casing, and (iii) a fiber having a first portion encapsulated by the casing and a second portion extending beyond the casing. The electrical cable connector assembly further includes a housing having a first end to receive the flexible cable and a second end with a connector to connect with another connector. The electrical cable connector assembly further includes a circuit board disposed in the housing. The circuit board includes: (i) a first plurality of terminals to connect with the plurality of electrical wires, (ii) a second plurality of terminals to connect with the connector, (iii) a plurality of traces coupling respective terminals of the first plurality of terminals with respective terminals of the second plurality of terminals, and (iv) a cleat. The second portion of the fiber extends beyond the casing to the cleat and winds around the cleat.

In accordance with some embodiments, an electrical cable connector assembly includes a circuit board, comprising (i) a first plurality of terminals to connect with a plurality of electrical wires in a flexible cable, (ii) a second plurality of terminals to connect with a connector, (iii) a plurality of traces coupling respective terminals of the first plurality of terminals with respective terminals of the second plurality of terminals, and (iv) a cleat to receive one or more fibers, the one or more fibers to be wound around the cleat.

In accordance with some embodiments, a method of fabricating an electrical cable connector assembly comprises forming a cleat on a circuit board and disposing the circuit board in a housing having a first end that receives a flexible cable and a second end having a connector. The flexible cable includes (i) a casing, (ii) a plurality of electrical wires each having a first portion encapsulated by the casing and a second portion extending beyond the casing, and (iii) a fiber having a first portion encapsulated by the casing and a second portion extending beyond the casing. The method further includes electrically coupling the plurality of electrical wires with a first plurality of terminals of the circuit board and electrically coupling the connector with a second plurality of terminals of the circuit board. A plurality of traces disposed on the circuit board electrically couples respective terminals of the first plurality of terminals with respective terminals of the second plurality of terminals. The method further includes winding the fiber around the cleat.

BRIEF DESCRIPTION OF THE DRAWINGS

For a better understanding of the various described embodiments, reference should be made to the Detailed Description below, in conjunction with the following drawings. Like reference numerals refer to corresponding parts throughout the figures and description.

DETAILED DESCRIPTION

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known systems, methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first connector could be termed a second connector, and, similarly, a second connector could be termed a first connector, without departing from the scope of the various described embodiments. The first connector and the second connector are both connectors, but they are not the same connectors.

The terminology used in the description of the various embodiments described herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
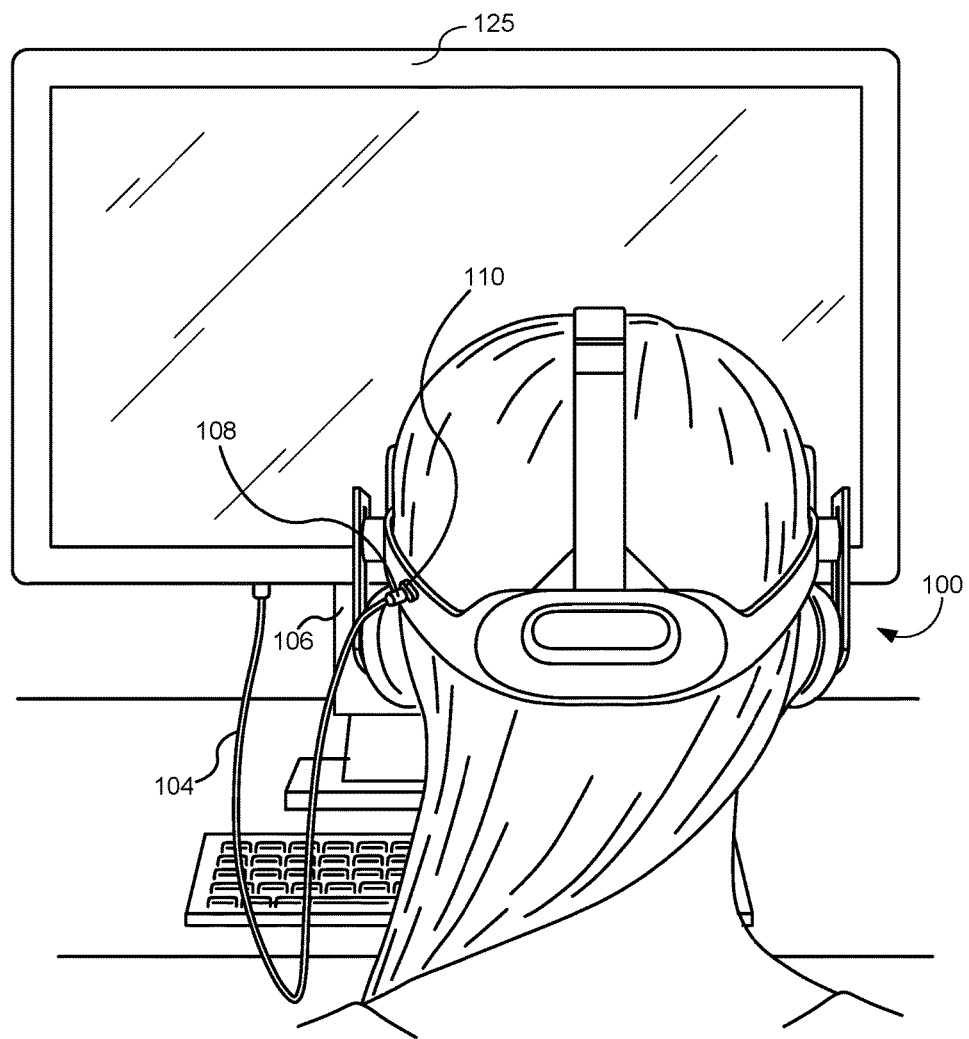
FIG. 1 is a view of a virtual-reality system that includes a computer, a head-mounted display, and a cable along with first and second connectors that connect the head-mounted display with the computer, in accordance with some embodiments.

FIG. 1 is a view of a virtual reality (VR) system that includes a head-mounted display (HMD) 100, a computer 125, and a housing (e.g., housing 209, FIG. 2A) with a first connector 108 coupled to a second connector 110. The first connector 108 and the second connector 110 couple the HMD 100 to the computer 125 through a cable 104. The first connector 108 is situated at an end of the cable 104. The computer 125 (e.g., desktop computer, laptop, cell phone, PDA, tablet, gaming console, etc.) is shown as a desktop computer and the cable 104 is shown as being connected to the monitor of the desktop computer; however, the cable 104 may also be connected to an enclosure (e.g., the processing tower 106 (CPU tower)) of the computer 125.

In some embodiments, the second connector 110 is disposed on a housing of the HMD 100 and the first connector 108 is communicatively coupleable to the computer 125 through the cable 104, which is adapted to transmit video/audio data from the computer 125 to the HMD 100. The HMD 100 is communicatively coupled to the computer 125 to receive the video and/or audio input from the computer 125 when the cable 104 is plugged into the computer 125 and the first and second connectors 108 and 110 are connected. The second connector 110 is electrically coupled to the HMD 100 (e.g., to the HMD mainboard 204, FIG. 2A).

Figure 2A:
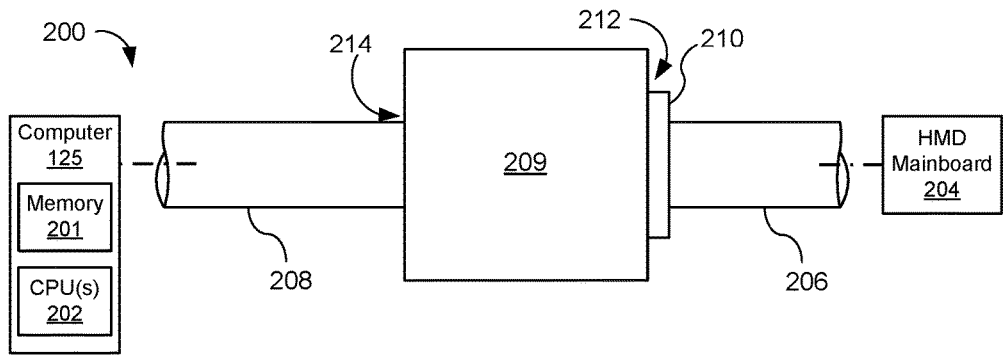
FIG. 2A is a side view of a connector assembly for the virtual-reality system, in accordance with some embodiments.

FIG. 2A is a side view of a connector assembly 200 for the VR system, in accordance with some embodiments. The connector assembly 200 includes a housing 209. The housing 209 may be formed of plastic, glass, ceramics, fiber composites, metal (e.g., stainless steel, aluminum, etc.), other suitable materials, or a combination of any two or more of these materials. In some embodiments, the housing 209 may be formed using a unibody configuration in which some or all of the housing 209 is machined or molded as a single structure or may be formed using multiple structures (e.g., an internal frame structure and one or more structures that form exterior housing surfaces, etc.). The housing 209 houses a first connector (e.g., a plug, not shown), which may be an example of the first connector 108 (FIG. 1). The housing 209 and associated first connector connect to a cable 208 (e.g., cable 104, FIG. 1).

The connector assembly 200 includes a second connector 210, which may be an example of the second connector 110 (FIG. 1). (Alternately, the second connector 210 may be an example of the first connector 108 and the first connector in the housing 209 may be an example of the second connector 110.) In some embodiments, the second connector 210 is coupled to a cable 206, which is in turn coupled to a HMD mainboard 204. Alternatively, in some embodiments, the second connector 210 is directly coupled to the HMD mainboard 204. A connection 212 may be formed between the first connector and the second connector 210

The cable 208 may be coupled to a computer 125. Computer 125 includes memory 201 and one or more processors 202 (CPU(s)). Memory 201 includes random-access memory and may include non-volatile memory, such as one or more magnetic disk storage devices, optical disk storage devices, flash memory devices, and/or other non-volatile solid-state storage devices. Memory 201 includes a non-transitory computer-readable storage medium. Instructions for operation of the processor(s) 202 may be stored in memory (e.g., a non-transitory computer-readable storage medium), such as the memory 201.

In some embodiments, the housing 209 includes an opening 214 configured to receive flexible cable 208 (e.g., the opening 214 may be in a sidewall of the housing 209). To illustrate, the opening 214 may have a diameter this is approximately equal to the diameter of the flexible cable 208. In some embodiments, an inner surface of the opening 214 is scored (or knurled) to increase friction between the inner surface of the opening 214 and an outer surface of the flexible cable 208 (e.g., a casing of the flexible cable 208).

Figure 2B:
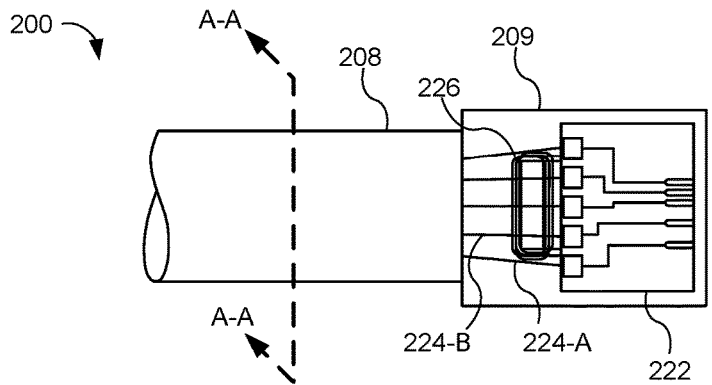
FIG. 2B is a side view of the connector assembly for the virtual-reality system, in accordance with some embodiments.

FIG. 2B is a side view of the connector assembly 200 for the VR system, in accordance with some embodiments. For ease of discussion, the housing 209 in FIG. 2B is transparent so that components inside the housing 209 are visible. In addition, reference numerals for certain components have been left out for clarity.

The flexible cable 208 includes a plurality of electrical wires (e.g., electrical wires 224-A, 224-B, etc.). Each of the plurality of electrical wires has a first portion encapsulated by a casing (e.g., casing 302, FIGS. 3A-3C) of the flexible cable 208 and a second portion extending beyond the casing. For example, electrical wire 224-A includes a first portion encapsulated by the casing, and a second portion (e.g., the portion visible inside housing 209) extending beyond the casing. Each of the plurality of electrical wires is electrically coupled to a terminal (e.g., terminal 232-A, 232-B, etc., FIG. 2C) of circuit board 222 by techniques known by those skilled in the art (e.g., soldering). In some embodiments, the second portion of each of the plurality of electrical wires is not taut when coupled to a respective terminal.

The flexible cable 208 also includes at least one fiber 226. The at least one fiber 226 includes a first portion encapsulated by the casing and a second portion (e.g., portion visible inside housing 209) extending beyond the casing. The at least one fiber 226 is wound around an anchor cleat (e.g., cleat 238, FIG. 2C) of the circuit board 222 to secure the flexible cable 208 to the circuit board (and in turn, the housing 209). In some embodiments, the second portion of the at least one fiber 226 is substantially longer than the second portion of each of the plurality of electrical wires, to accommodate the winding. In some embodiments, the at least one fiber 226 is taut after being wound around the cleat. In such a configuration, the at least one fiber 226 is subjected to tension forces experience by the flexible cable 208 (or more generally, the connector assembly 200). In addition, the at least one fiber 226 relieves the plurality of electrical wires from being subjected to tension forces experienced by the flexible cable 208. In this way, the at least one fiber 226 experiences tension forces that might otherwise damage one or more of the plurality of electrical wires.

The at least one fiber 226 may be any fiber having suitable mechanical properties (e.g., mechanical properties that satisfy one or more criteria, such as threshold tensile strength, threshold stiffness, threshold toughness, threshold heat resistance, etc.). For example, the at least one fiber 226 may be any one of a polyester fiber, a nylon fiber, an aramid fiber (e.g., a KEVLAR® fiber produced by DUPONT), or the like. The plurality of electrical wires and the at least one fiber are discussed in further detail below with reference to FIGS. 3A-3C.

Figure 2C:
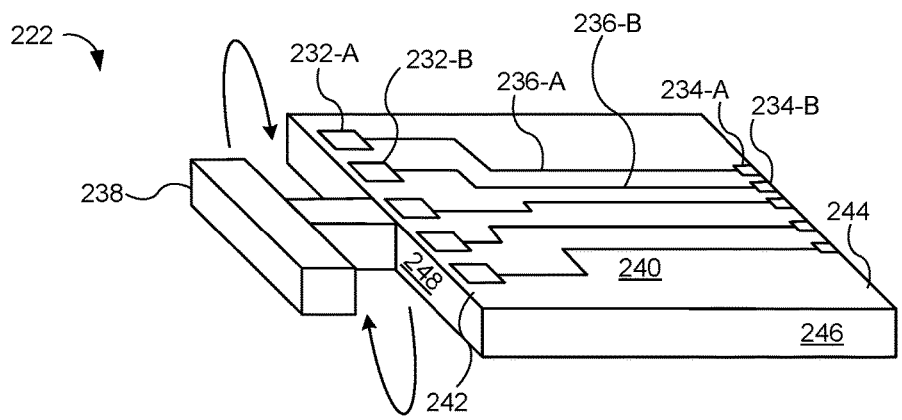
FIG. 2C is an isometric view of a circuit board included in the connector assembly, in accordance with some embodiments.

FIG. 2C is an isometric view of a circuit board 222 housed in the housing 209, in accordance with some embodiments. The circuit board 222 includes a first plurality of terminals (e.g., terminals 232-A, 232-B, etc., FIG. 2C) connected with a second plurality of terminals (e.g., terminals 234-A, 234-B, etc., FIG. 2C) via a plurality of traces (e.g., traces 236-A, 236-B, etc., FIG. 2C) that couple respective terminals of the first plurality of terminals with respective terminals of the second plurality of terminals. For example, a first terminal 232-A of the first plurality of terminals is coupled to a first terminal 234-A of the second plurality of terminals via a first trace 236-A of the plurality of traces. The first plurality of terminals is configured to connect with the plurality of electrical wires of the flexible cable 208. The second plurality of terminals is configured to connect with the second connector 210.

For ease of illustration, reference numerals for certain components in FIG. 2C have been left out for clarity. For example, only two terminals of each of the first and second pluralities of terminals include reference numerals for ease of illustration.

In some embodiments, the circuit board 222 is coupled to an inner surface of the housing 209 via mechanical fasteners and/or adhesives. In some embodiments, the circuit board 222 is a printed circuit board (e.g., a rigid or flexible printed circuit board).

In some embodiments, the first plurality of terminals 232-A, 232-B, etc. is formed on a top surface 240 of the circuit board 222. In some embodiments, the first plurality of terminals 232-A, 232-B, etc. is further formed proximate to a first edge 242 on the top surface 240 of the circuit board 222.

In some embodiments, the second plurality of terminals 234-A, 234-B, etc. is formed on the top surface 240 of the circuit board 222. In some embodiments, the second plurality of terminals is further formed proximate a second edge 244 on the top surface 240 of the circuit board 222. In some embodiments, the first edge 242 and the second edge 244 are opposing edges. Alternatively, in some embodiments, the first edge and the second edge are adjacent edges. In some embodiments, the second plurality of terminals is formed on a different surface of the circuit board 222 (or alternatively, the first plurality of terminals may be formed on a different surface of the circuit board 222).

In some embodiments, the first plurality of terminals and/or the second plurality of terminals may be formed at least partially on a side of the circuit board (e.g., side 246 of the circuit board 222). In some embodiments, the first plurality of terminals is formed on a first side of the circuit board 222 and the second plurality of terminals is formed on a second side of the circuit board 222. In some embodiments, the first and second sides are opposing sides.

Although FIGS. 2B-2C show five first terminals, five second terminals, and five traces, this is merely for illustrative purposes. One skilled in the art will appreciate that the circuit board 222 may include any number of traces and terminals, depending on the situation.

The circuit board 222 further includes a cleat 238. The cleat 238 is configured to receive the at least one fiber 226 of the flexible cable 208 (e.g., the at least one fiber 226 is wound around the cleat 238, as illustrated by arrows in FIG. 2C). The flexible cable 208 is mechanically coupled to the circuit board 222, and in turn the housing 209, by winding the at least one fiber 226 around the cleat 238. As shown, the cleat 238 may be a "T" shape that extends away from a side of the circuit board 222.

Figure 5A:
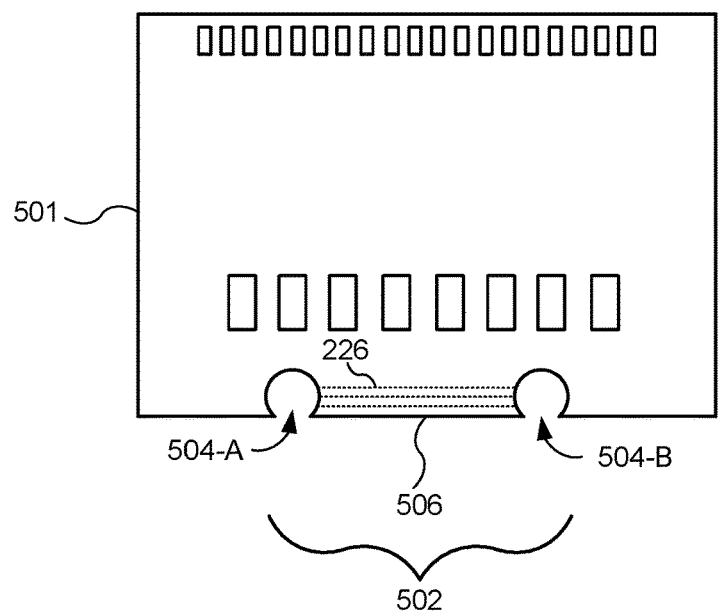
FIGS. 5A-5B are top views of circuit boards included in the connector assembly, in accordance with some embodiments.

In some embodiments, the cleat is formed into a side (e.g., side 248) of the circuit board 222. For example, as shown in FIG. 5A, the cleat 502 is formed into a side of the circuit board 501. In this example, the cleat 502 includes a first cutout 504-A, a second cutout 504-B, and a portion 506 of the circuit board 501 defined between the first and second cutouts. The first 504-A and second 504-B cutouts are configured to receive the at least one fiber 226 (dotted lines), which is wrapped around the portion 506 of the circuit board 501 by way of the first and second cutouts 504-A, 504-B.

In some embodiments, the cleat 238 is formed on a side (e.g., side 248) of the circuit board 222. The cleat 238 may also be positioned at any location on the circuit board 222. In the example of FIG. 2C, the cleat 238 as shown is centered on the side 248. However, the cleat 238 may be positioned elsewhere along the side 248, depending on the situation. In some embodiments, the cleat 238 is formed on a surface of the circuit board 222 (e.g., top surface 240 or some other surface).

In some embodiments, the cleat is an integral part of the circuit board 222. In some embodiments, the cleat 238 is mechanically or chemically (e.g., using adhesives) attached to the circuit board 222. In some embodiments, the cleat 238 is formed from the same material(s) as the circuit board 222. In some embodiments, the cleat 238 and the circuit board 222 are formed from different materials.

In some embodiments, the flexible cable 208 includes at least two fibers and the cleat 238 is configured to receive the at least two fibers, which are wound around the cleat.

In some embodiments, the circuit board 222 includes a plurality of cleats. A first cleat (e.g., cleat 510-A, FIG. 5B) of the plurality may be configured to receive a first fiber of the flexible cable 208 and a second cleat (e.g., cleat 510-B, FIG. 5B) of the plurality may be configured to receive a second fiber of the flexible cable 208. In some embodiments, the first cleat may be formed at a first position on a side of the circuit board 222 and the second cleat may be formed at a second position on the side of the circuit board 222, the first and second positions being separated by a distance. In some embodiments, the first cleat may be formed on a first side of the circuit board 222 and a second cleat may be formed on a second (e.g., opposite) side of the circuit board 222 (e.g., cleats 510-A and 510-B are formed on opposing sides of the circuit board 508, FIG. 5B). In some embodiments, the first cleat may be formed on a first surface of the circuit board 222 and a second cleat may be formed on a second (e.g., opposite) surface of the circuit board 222. In some embodiments, the first cleat may be formed on a side of the circuit board 222 and a second cleat may be formed on a surface of the circuit board 222, or vice versa.

Figure 5B:
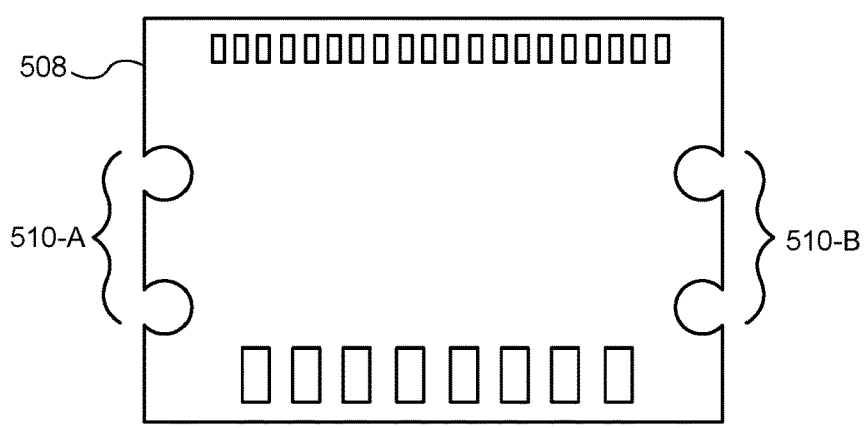

In some embodiments, as shown in FIG. 2C, the cleat 238 and the first plurality of terminals are formed on the same edge of the circuit board 222. Alternatively, in some embodiments, the cleat (or a plurality of cleats) and the first plurality of terminals (and/or the second plurality of terminals) are formed on different edges of the circuit board 222. For example, the cleat 238 may be formed on a first edge of the circuit board and the first plurality of terminals may be formed on a second edge of the circuit board, where the second edge is perpendicular to the first edge (e.g., as shown in FIG. 5B).

Figure 3A:
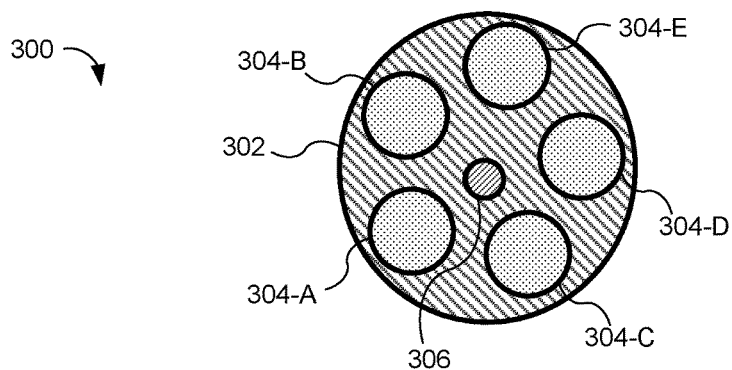
FIGS. 3A-3C are cross-sectional views of a flexible cable included in the connector assembly, in accordance with some embodiments.

FIG. 3A shows a cross-sectional view (line A-A, FIG. 2B) of the flexible cable 300, in accordance with some embodiments. Certain components of the flexible cable 300 have been left out, for ease of illustration. The flexible cable 300 may be an example of the flexible cable 208 (FIGS. 2A-2B). The flexible cable 300 includes a casing 302. The casing 302 (also called a jacket) houses a plurality of electrical wires 304-A-304-E and a fiber 306. The casing 302 may be made of any suitable material known by those skilled in the art.

The plurality of electrical wires 304-A-304-E are distributed throughout a cross-section of the flexible cable 300. The plurality of electrical wires 304-A-304-E may be an example of the plurality of electrical wires 224-A, 224-B, and so on (FIG. 2B). The plurality of electrical wires may be made of any suitable material known by those skilled in the art (e.g., copper, aluminum, etc.). In some embodiments, each electrical wire in the plurality of electrical wires is the same. Alternatively, in some embodiments, one or more electrical wires in the plurality of wires differ in size, shape, and/or material. In some embodiments, a number of electrical wires in the plurality of electrical wires correspond to a number of terminals in the first plurality of terminals (and in turn, to a number of traces in the plurality of traces and a number of terminals in the second plurality of terminals).

The flexible cable 300 also includes a fiber 306. The fiber 306 may be an example of the fiber 226 (FIG. 2B). In some embodiments, the fiber 306 is located between one or more electrical wires of the plurality of electrical wires. The fiber 306 may be any one of a polyester fiber, a nylon fiber, an aramid fiber (e.g., a KEVLAR® fiber produced by DUPONT™), or the like. In some embodiments, the fiber 306 is formed by braiding multiple fibers.

Figure 3B:
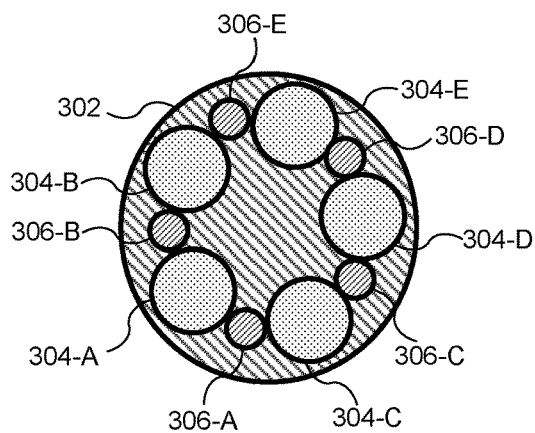

FIG. 3B shows an alternative cross-sectional view (line A-A, FIG. 2B) of the flexible cable 300, in accordance with some embodiments. The flexible cable 300 includes a plurality of electrical wires 304-A-304-E and a plurality of fibers 306-A-306-E. In addition, respective fibers of the plurality of fibers 306-A-306-E are disposed between adjacent electrical wires of the plurality of electrical wires. Although not shown, a central portion of the flexible cable 300 may include additional electrical wires and/or fibers.

Figure 3C:
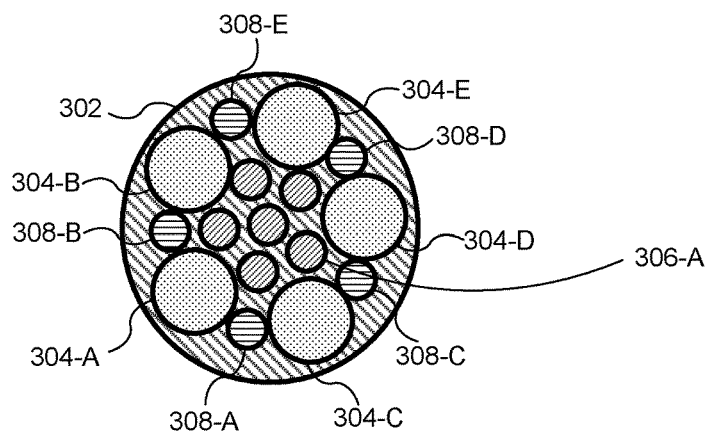

FIG. 3C shows another alternative cross-sectional view (line A-A, FIG. 2B) of the flexible cable 300, in accordance with some embodiments. The flexible cable 300 includes a plurality of electrical wires 304-A-304-E, a plurality of fibers 306-A-306-F (reference numbers for 306-B-306-F left out for clarity), and filler material 308-A-308-E. The filler material 308-A-308-E is disposed between adjacent electrical wires of the plurality of electrical wires. In this way, an overall shape of the flexible cable 300 is circular (or some other desired shape). In some embodiments, the filler material and the plurality of fibers swap positions in the cross-section.

Figure 4:
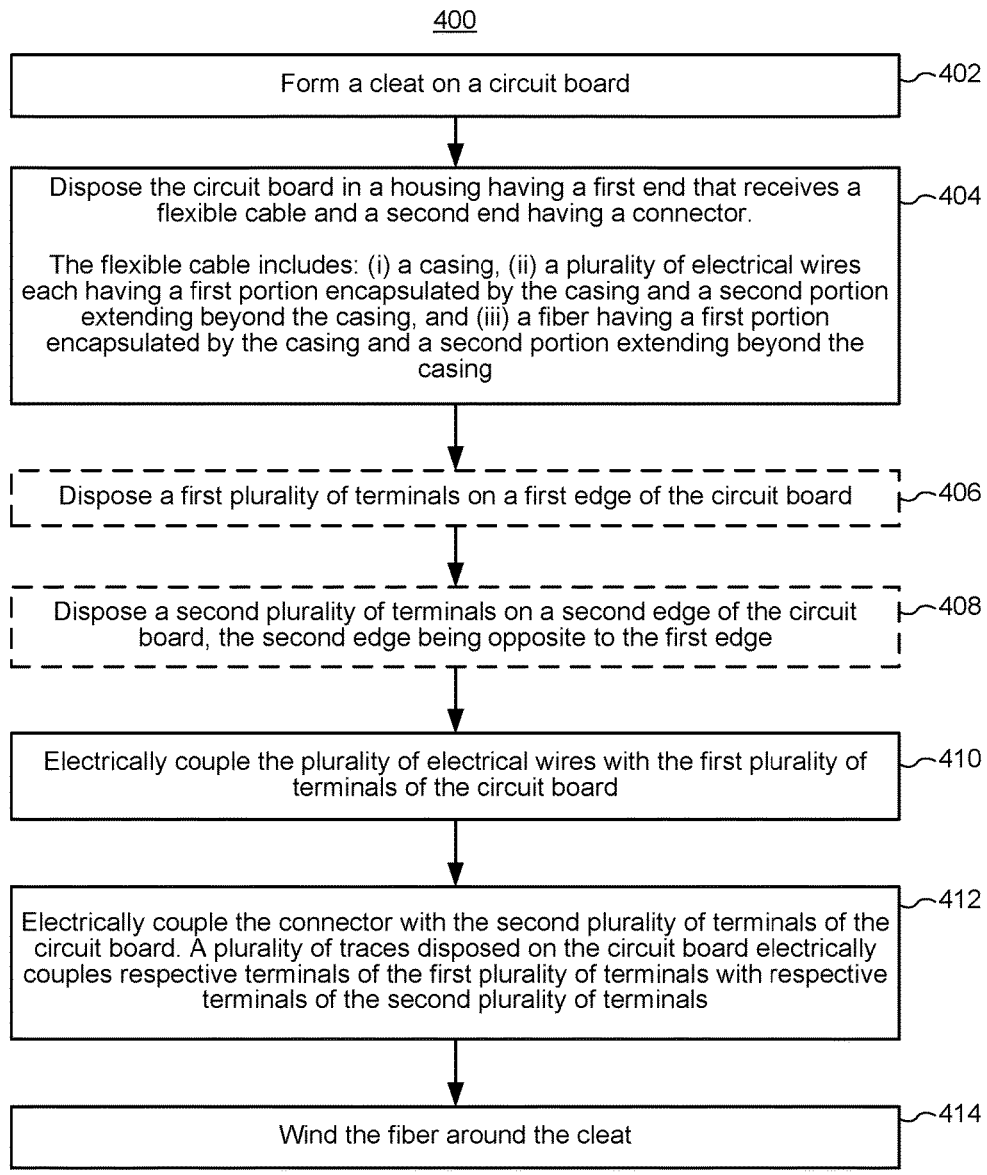
FIG. 4 is a flow diagram for a process of fabricating the connector assembly, in accordance with some embodiments.

FIG. 4 is a flow diagram illustrating a method 400 of fabricating the connection assembly 200, in accordance with some embodiments. In some embodiments, the method 400 includes forming (402) a cleat (e.g., cleat 238, FIG. 2C) on a circuit board (e.g., circuit board 222, FIGS. 2B-2C). In some embodiments, the cleat is an integral part of the circuit board. For example, forming the cleat may include casting, injection molding, or milling the circuit board to form the cleat. In some embodiments, the cleat is mechanically or chemically attached to the circuit board. In some embodiments, the cleat is formed on an edge of the circuit board and extends away from the edge. In some embodiments, the cleat is formed on a surface of the circuit board.

The method 400 further includes disposing (404) the circuit board in a housing (e.g., housing 209, FIG. 2A) having a first end that receives a flexible cable (e.g., flexible cable 208, FIG. 2A) and a second end having a connector (e.g., first connector 108, FIG. 1). The flexible cable includes (i) a casing (e.g., casing 302, FIGS. 3A-3C), (ii) a plurality of electrical wires (e.g., electrical wires 224-A, 224-B, etc., FIG. 2B) each having a first portion encapsulated by the casing and a second portion extending beyond the casing, and (iii) a fiber (e.g., fiber 226, FIG. 2B) having a first portion encapsulated by the casing and a second portion extending beyond the casing. In some embodiments, the circuit board is mechanically or chemically attached to an inner surface of the housing.

In some embodiments, the method 400 includes disposing (406) a first plurality of terminals on (e.g., proximate to) a first edge of the circuit board. For example, referring to FIG. 2C, a first plurality of terminals 232-A, 232-B, etc. is disposed on a first edge 242 of the circuit board 222.

In some embodiments, the method 400 includes disposing (408) a second plurality of terminals on (e.g., proximate to) a second edge of the circuit board, the second edge being opposite to the first edge. For example, referring to FIG. 2C, a second plurality of terminals 234-A, 234-B, etc. is disposed on a second edge 244 of the circuit board 222. The second edge 244 as shown is opposite the first edge 242. Terminals are discussed in further detail above with reference to FIG. 2C.

The method 400 further includes electrically coupling (410) the plurality of electrical wires with the first plurality of terminals of the circuit board. Each of the plurality of electrical wires is electrically coupled with a respective terminal of the first plurality of terminals.

The method 400 further includes electrically coupling (412) the connector with the second plurality of terminals of the circuit board. A plurality of traces (e.g., traces 236-A, 236-B, etc., FIG. 2C) disposed on the circuit board electrically couples respective terminals of the first plurality of terminals with respective terminals of the second plurality of terminals. Traces are discussed in further detail above with reference to FIG. 2C.

The method 400 further includes winding (414) the fiber around the cleat. For example, as illustrated by the arrows in FIG. 2C, the fiber may be wound around the cleat 238 in a clock-wise fashion (or alternatively, a counter-clockwise fashion). In some embodiments, winding the fiber around the cleat includes performing a predefined number of winds around the cleat. In some embodiments, winding the fiber around the cleat caused the fiber to become taut, thereby subjecting the fiber to tension forces experienced by the flexible cable.

FIGS. 5A-5B are top views of circuit boards included in the connector assembly, in accordance with some embodiments. The circuit boards 501 and 508 each include a first plurality of terminals (e.g., the first plurality of terminals 232-A, 232-B, etc., FIG. 2C) and a second plurality of terminals (e.g., the second plurality of terminals 234-A, 234-B, etc., FIG. 2C). In addition, the circuit board 501 includes a cleat 502 and the circuit board 508 includes a plurality of cleats 510-A, 510-B. The cleat 502 includes a first cutout 504-A, a second cutout 504-B, and a portion 506 of the circuit board 501 (cleats 510-A and 510-B include similar features). Although the cutouts 504-A, 504-B are shown as circular, other cutout shapes can be used. The cleats shown in FIGS. 5A-5B are described in further detail above with reference to FIG. 2C.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electrical cable connector assembly, comprising:
a flexible cable including:
a casing;
a plurality of electrical wires each having a first portion encapsulated by the casing and a second portion extending beyond the casing;
a fiber having a first portion encapsulated by the casing and a second portion extending beyond the casing;
a housing having a first end to receive the flexible cable and a second end with a connector to connect with another connector; and
a circuit board disposed in the housing, the circuit board comprising:
a first plurality of terminals to connect with the plurality of electrical wires;
a second plurality of terminals to connect with the connector;
a plurality of traces coupling respective terminals of the first plurality of terminals with respective terminals of the second plurality of terminals; and
a cleat, wherein the second portion of the fiber extends beyond the casing to the cleat and winds around the cleat.

2. The electrical cable connector assembly of claim 1, wherein:
the first plurality of terminals is disposed on a first edge of the circuit board; and
the second plurality of terminals is disposed on a second edge of the circuit board, the second edge being opposite to the first edge.

3. The electrical cable connector assembly of claim 2, wherein the cleat is formed on the first edge of the circuit board and extends away from the first edge.

4. The electrical cable connector assembly of claim 1, wherein the cleat is an integral part of the circuit board.

5. The electrical cable connector assembly of claim 1, wherein the second portion of the plurality of electrical wires extends past the cleat towards the second end of the housing and is electrically connected to the circuit board via the first plurality of terminals.

6. The electrical cable connector assembly of claim 1, wherein the second portion of the fiber is longer than the second portion of each of the plurality of electrical wires.

7. The electrical cable connector assembly of claim 1, wherein the fiber is a polyester fiber, a nylon fiber, or an aramid fiber.

8. The electrical cable connector assembly of claim 1, wherein:
the fiber is a first fiber;
the flexible cable further includes a plurality of fibers including the first fiber;
each fiber of the plurality of fibers has a first portion encapsulated by the casing and a second portion extending beyond the casing; and
the second portion of each fiber of the plurality of fibers is wound around the cleat.

9. The electrical cable connector assembly of claim 8, wherein respective fibers of the plurality of fibers are disposed between adjacent electrical wires of the plurality of electrical wires.

10. An electrical cable connector assembly, comprising:
a circuit board comprising:
a first plurality of terminals to connect with a plurality of electrical wires in a flexible cable;
a second plurality of terminals to connect with a connector;
a plurality of traces coupling respective terminals of the first plurality of terminals with respective terminals of the second plurality of terminals; and
a cleat to receive one or more fibers, the one or more fibers to be wound around the cleat.

11. The electrical cable connector assembly of claim 10, wherein:
the first plurality of terminals is disposed on a first edge of the circuit board;
the second plurality of terminals is disposed on a second edge of the circuit board; and
the first edge is opposite to the second edge.

12. The electrical cable connector assembly of claim 11, wherein the cleat is on the first edge of the circuit board and extends away from the first edge.

13. The electrical cable connector assembly of claim 10, wherein the cleat is an integral part of the circuit board.

14. The electrical cable connector assembly of claim 10, wherein the one or more fibers are polyester fibers, nylon fibers, or aramid fibers.

15. The electrical cable connector assembly of claim 10, further comprising a housing having a first end with an opening to receive the flexible cable and a second end with the connector,
wherein the circuit board is disposed in the housing.

16. The electrical cable connector assembly of claim 15, further comprising the flexible cable disposed in the opening of the housing, wherein the flexible cable comprises:
a casing;
the plurality of electrical wires, each of the plurality of electrical wires having a first portion encapsulated by the casing and a second portion extending beyond the casing; and
the one or more fibers, each of the one or more fibers having a first portion encapsulated by the casing and a second portion extending beyond the casing.

17. A method of making a cable connector assembly comprising:
forming a cleat on a circuit board;
disposing the circuit board in a housing having a first end that receives a flexible cable and a second end having a connector, wherein the flexible cable includes:
a casing,
a plurality of electrical wires each having a first portion encapsulated by the casing and a second portion extending beyond the casing, and
a fiber having a first portion encapsulated by the casing and a second portion extending beyond the casing;
electrically coupling the plurality of electrical wires with a first plurality of terminals of the circuit board;
electrically coupling the connector with a second plurality of terminals of the circuit board, wherein a plurality of traces disposed on the circuit board electrically couples respective terminals of the first plurality of terminals with respective terminals of the second plurality of terminals; and
winding the fiber around the cleat.

18. The method of claim 17, further comprising:
 disposing the first plurality of terminals on a first edge of the circuit board; and
 disposing the second plurality of terminals on a second edge of the circuit board, the second edge being opposite to the first edge.

19. The method of claim 18, wherein the cleat is formed on the first edge of the circuit board and extends away from the first edge.

20. The method of claim 17, wherein forming the cleat on the circuit board comprises casting, injection molding, or milling the circuit board to form the cleat.

\* \* \* \* \*